(12) United States Patent
Chang et al.

(10) Patent No.: US 9,935,643 B1
(45) Date of Patent: Apr. 3, 2018

(54) ADAPTIVE CHARGING SYSTEMS AND METHODS FOR A SUCCESSIVE-APPROXIMATION ANALOG-TO-DIGITAL CONVERTER

(71) Applicant: Marvell International Ltd., Hamilton (BM)

(72) Inventors: Nick C. Chang, Los Altos, CA (US); Kenneth Thet Zin Oo, San Jose, CA (US); Wyant Chan, Mountain View, CA (US); Pierte Roo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/453,567

(22) Filed: Mar. 8, 2017

Related U.S. Application Data

(60) Provisional application No. 62/305,020, filed on Mar. 8, 2016, provisional application No. 62/305,024, filed on Mar. 8, 2016.

(51) Int. Cl.
*H03M 1/00* (2006.01)
*H03M 1/80* (2006.01)
*H03M 1/06* (2006.01)
*H03M 1/12* (2006.01)

(52) U.S. Cl.
CPC .............. *H03M 1/001* (2013.01); *H03M 1/00* (2013.01); *H03M 1/0695* (2013.01); *H03M 1/12* (2013.01); *H03M 1/804* (2013.01)

(58) Field of Classification Search
CPC ........ H03M 1/00; H03M 1/12; H03M 1/0695; H03M 1/804
USPC ................. 341/110, 161, 118, 155, 120, 172
See application file for complete search history.

(56) References Cited

U.S. PATENT DOCUMENTS 9,223,332 B1 * 12/2015 Himmelbauer ........... G05F 3/02

* cited by examiner

*Primary Examiner* — Joseph Lauture (57) ABSTRACT

A successive-approximation register (SAR) analog-to-digital converter (ADC) includes a SAR circuit configured to generate a digital code based on an analog input signal. A digital-to-analog converter (DAC) is configured to convert the digital code to an analog voltage. The SAR circuit is further configured to generate a digital output signal based on a comparison between the analog input signal and the analog voltage. A first capacitor is configured to provide a reference voltage to the DAC. An adaptive charging module is configured to stabilize the reference voltage provided to the DAC by selectively connecting to a supply voltage during a first operating phase of the ADC to store a charge in the adaptive charging module and selectively connecting to the first capacitor during a second operating phase of the ADC to combine the charge stored in the adaptive charging module with a charge of the first capacitor.

16 Claims, 8 Drawing Sheets

ADAPTIVE CHARGING SYSTEMS AND METHODS FOR A SUCCESSIVE-APPROXIMATION ANALOG-TO-DIGITAL CONVERTER

CROSS-REFERENCE TO RELATED APPLICATIONS

This application claims the benefit of U.S. Provisional Application No. 62/305,020, filed on Mar. 8, 2016 and U.S. Provisional Application No. 62/305,024, filed Mar. 8, 2016. The entire disclosures of the applications referenced above are incorporated herein by reference.

FIELD

The present disclosure relates to successive-approximation analog-to-digital converters, and more particularly to pre-charging and adaptive charging techniques for successive-approximation analog-to-digital converters.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A successive approximation register (SAR) analog-to-digital converter (ADC) converts an analog input (e.g., a waveform) into a discrete digital representation via a binary search through all possible quantization levels before finally converging upon a digital output for each conversion. A SAR ADC performs a successive approximation algorithm (sometimes referred to as "a binary search algorithm") to provide a binary digital code. When the approximation is completed, the SAR ADC outputs an estimated digital output indicating the binary code. A SAR ADC includes a capacitive digital-to-analog converter (DAC), a comparator, and a logic module or circuit (e.g., a SAR circuit) that converts an analog input voltage into a digital code. A reference generator provides a reference voltage to the DAC. A range of output voltages (i.e., a resolution) of the DAC is controlled by the reference voltage.

The reference voltage typically varies during operation of the DAC. Such voltage variation causes inaccurate conversion of analog signal into a digital signal, errors at an output of the ADC, non-linear ADC output, etc. As one example, the reference voltage typically decreases from an initial steady-state value in each conversion cycle, for instance when more current is drawn by the DAC for most-significant-bit (MSB) conversion (referred to as an MSB phase). Typically, the reference voltage subsequently increases, for instance due to less current being drawn for least-significant-bit (LSB) conversion (referred to as an LSB phase). The reference voltage typically returns to the steady-state value as the conversion cycle nears completion. As another example, the amount of current drawn by the DAC varies based on the input voltage provided to the ADC for conversion.

Accordingly, SAR ADCs include a decoupling capacitor connected at an input of the DAC to stabilize the reference voltage. The area of the decoupling capacitor is large relative to a total area of the DAC. For example, the decoupling capacitor occupies 50% or more of the total area of the DAC. In some examples, the decoupling capacitor is more than 400 times larger than a total capacitor size of the capacitive DAC.

SUMMARY

A successive-approximation register (SAR) analog-to-digital converter (ADC) includes a SAR circuit configured to generate a digital code based on an analog input signal. A digital-to-analog converter (DAC) is configured to convert the digital code to an analog voltage. The SAR circuit is further configured to generate a digital output signal based on a comparison between the analog input signal and the analog voltage. A first capacitor (e.g., a reference capacitor) is configured to provide a reference voltage to the DAC. An adaptive charging module is configured to stabilize the reference voltage provided to the DAC. To stabilize the reference voltage, the adaptive charging module is configured to receive an indication of an operating phase of the ADC, and, based on the indication, selectively connect to a supply voltage during a first operating phase of the ADC to store a charge in the adaptive charging module and selectively connect the adaptive charging module to the reference capacitor during a second operating phase of the ADC to combine the charge stored in the adaptive charging module with a charge of the reference capacitor.

A method of operating a successive-approximation register (SAR) analog-to-digital converter (ADC) including a digital-to-analog converter (DAC) includes generating a digital code based on an analog input signal and converting the digital code to an analog voltage. Converting the digital code to the analog voltage includes providing a reference voltage from a first capacitor for conversion of the digital code to the analog voltage and stabilizing the reference voltage by receiving an indication of an operating phase of the ADC and, based on the indication, selectively connecting at least one second capacitor to a supply voltage during a first operating phase of the ADC to store a charge in the at least one second capacitor and selectively connecting to the first capacitor during a second operating phase of the ADC to combine the charge of the at least one second capacitor with a charge of the first capacitor. The method further includes generating a digital output signal based on a comparison between the analog input signal and the analog voltage.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers are reused to identify similar and/or identical elements.

DESCRIPTION

Figure 1:
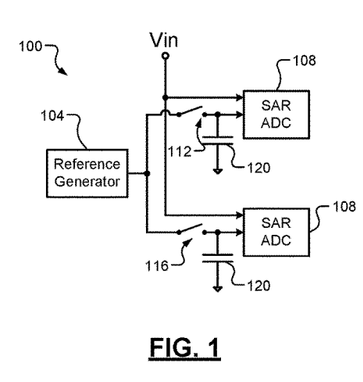
FIG. 1 is an example analog-to-digital converter system according to the present disclosure.

FIG. 1 shows an example analog-to digital converter (ADC) system 100 according to an embodiment of the present disclosure. The ADC system 100 includes a reference generator 104 that provides a reference voltage to two or more successive-approximation register (SAR) ADCs 108. For example, switches 112 and 116 (e.g., implemented by a multiplexer) are operated to selectively provide the reference voltage to the ADCs 108. Each of the ADCs 108 is connected to a respective decoupling capacitor 120. As another example, switches 112 and 116 may be selected to remain closed at all times. Each of the decoupling capacitors 120 is connected to the reference voltage during a tracking phase of the respective ADC 108 and disconnected from the reference voltage during a conversion phase of the respective ADC 108.

Figure 2:
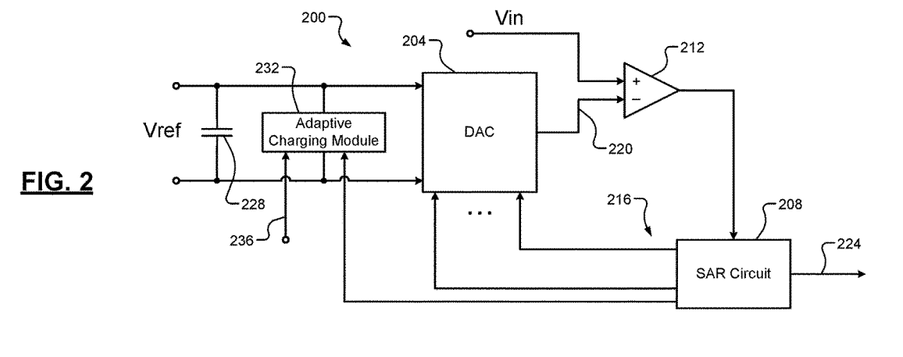
FIG. 2 is an example successive-approximation analog-to-digital converter including an adaptive charging module according to the present disclosure.

FIG. 2 shows a first example SAR ADC 200 (e.g., corresponding to one of the SAR ADCs 108 of FIG. 1) according to an embodiment of the present disclosure. The ADC 200 includes a capacitive digital-to-analog converter (DAC) 204, a SAR circuit 208, and a comparator 212. The SAR circuit 208 provides a digital code 216 generated according to an input voltage Vin received by the comparator 212, in an embodiment. For example, the input voltage Vin is an analog input to be converted to a digital value by the ADC 200. The DAC 204 converts the digital code 216 into an analog voltage 220 and provides the analog voltage 220 to the comparator 212. Accordingly, an output of the comparator 212 corresponds to a comparison between the input voltage Vin and the analog voltage 220. The SAR circuit 208 stores outputs of the comparator and iteratively modifies bits of the digital code 216 until the digital code 216 is an accurate digitization of the input voltage Vin. In other words, the SAR circuit 208 modifies bits of the digital code 216, which are then converted by the DAC 204 to the analog voltage 220. The bits are modified in an iterative manner until the analog voltage 220 output from the DAC 204 is approximately equal to the input voltage Vin. The SAR circuit 208 outputs an estimated digital output 224 in accordance with the completed digital code 216.

The DAC 204 converts the digital code 216 into the analog voltage 220 based in part on a reference voltage Vref. In an embodiment, the ADC 200 includes a decoupling capacitor 228 coupled to an input of the DAC 204. In an embodiment, the SAR ADC 200 further includes an adaptive charging module 232 connected between the decoupling capacitor 228 and the DAC 204. The adaptive charging module 232 receives and is responsive to a portion of the digital code 216 and/or other inputs 236 as described below in more detail. In an embodiment, the adaptive charging module 232 is configured to provide a pre-charging voltage to improve settling of the reference voltage Vref during conversion cycles. In another embodiment, the adaptive charging module 232 is configured to provide a voltage to compensate for variation in the reference voltage (due to a varying Vin) provided to the SAR ADC 200. For example only, the ADC 200 as described herein corresponds to an ADC having 12-bit resolution.

Figure 3:
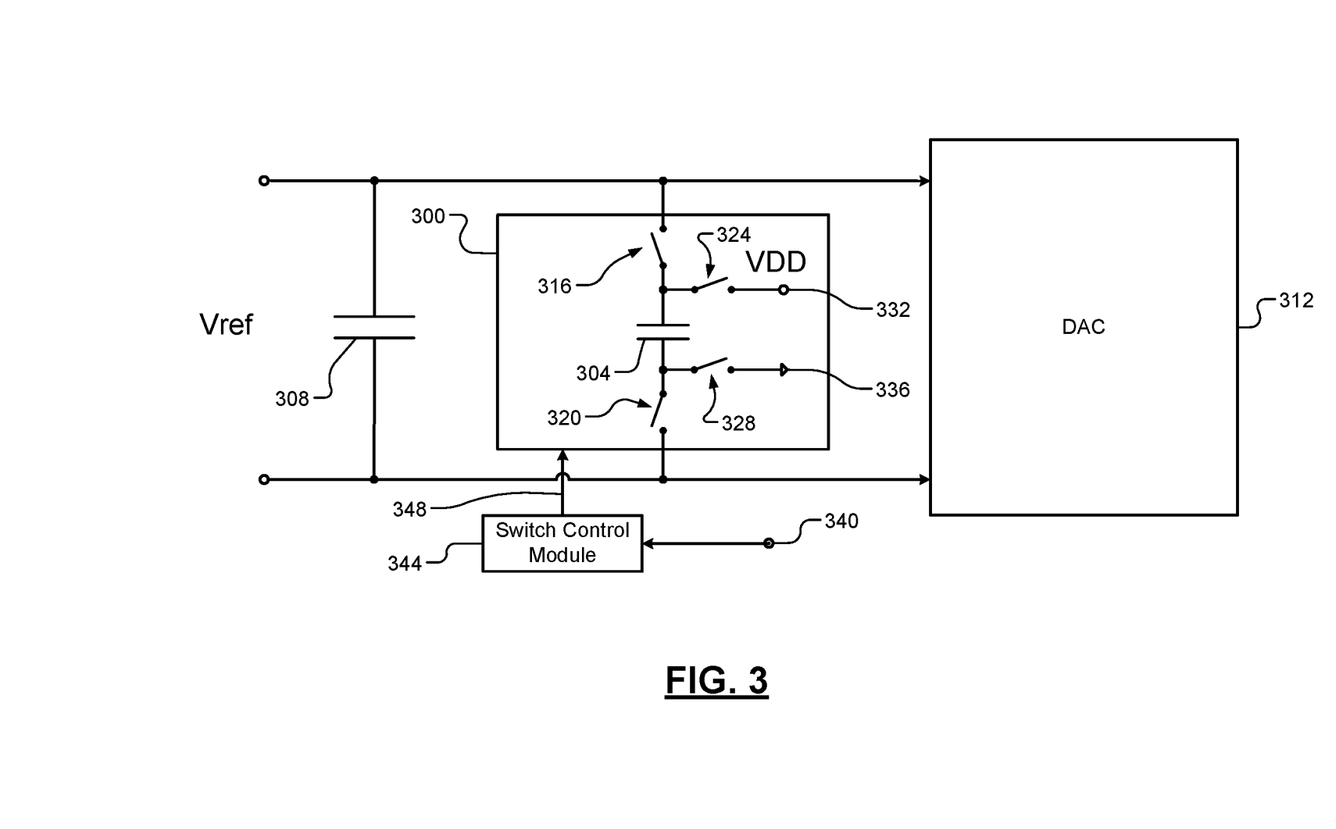
FIG. 3 is a first example of the adaptive charging module of FIG. 2 according to the present disclosure.

FIG. 3A shows a first example adaptive charging module 300 (e.g., corresponding to the adaptive charging module 232 of FIG. 2) in more detail. The adaptive charging module 300 includes a pre-charging capacitor 304 configured to provide a pre-charging voltage. For example, the pre-charging capacitor 304 is connected in parallel with decoupling capacitor 308. A voltage across the decoupling capacitor 308 corresponds to a reference voltage Vref provided to capacitive DAC 312. In an embodiment, the pre-charging capacitor 304 is formed of the same material (e.g., metal) as capacitors of the DAC 312. Accordingly, any process and temperature variations affecting the pre-charging capacitor DAC 312 are analogous to process variations of the capacitors of the DAC 312.

The adaptive charging module 300 includes first and second switches 316 and 320 arranged to selectively connect the pre-charging capacitor 304 to the reference voltage Vref and the decoupling capacitor 308. Third and fourth switches 324 and 328 selectively connect the pre-charging capacitor 304 to a supply voltage (VDD) 332 and ground 336. The first, second, third, and fourth switches 316, 320, 324, and 328 are responsive to an input 340 indicative of various operating phases of the DAC 312. For example, the DAC 312 has a conversion phase, a tracking phase, etc. In the tracking phase of an ADC (e.g., the ADC 200 of FIG. 2), the ADC 200 performs a sampling operation to store an analog value of an analog input voltage. In the conversion phase, the ADC 200 digitizes the stored analog value into the digital code 216.

In an embodiment, the input 340 corresponds to a square-wave clock signal provided to the ADC 200 that controls whether the ADC 200 is in the conversion phase or the tracking phase. Accordingly, the input 340 toggles (e.g., high or low) to indicate whether the ADC 200 is in the conversion phase or the tracking phase. In one example, the adaptive charging module 300 implements and/or communicates with a switch control module 344. The switch control module 344 is configured to receive the input 340 and generate a switching control signal 348 based on the input 340 to selectively open and close the switches 316, 320, 324, and 328. In an embodiment, when the input 340 is low, the ADC 200 is in the tracking phase, causing the switch control module 344 to open the switches 316 and 320 and close the switches 324 and 328. Conversely, when the input 340 is high, the ADC 200 is in the conversion phase, causing the switch control module 344 to close the switches 316 and 320 and open the switches 324 and 328. In FIG. 3A, the adaptive charging module 300 is shown connected between the decoupling capacitor 308 and the DAC 312.

Figure 4:
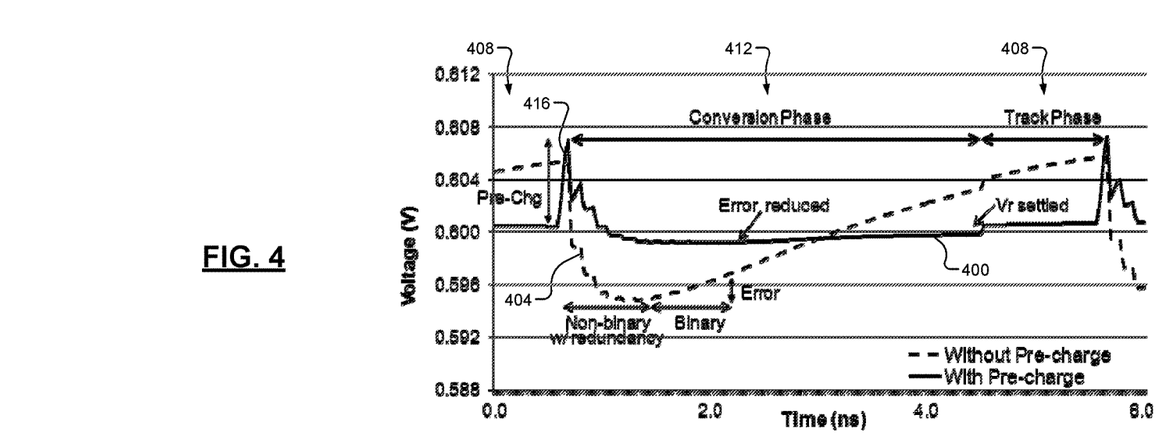
FIG. 4 is an example reference voltage provided to the successive-approximation analog-to-digital converter of FIG. 2 according to the present disclosure.

FIG. 4 shows a reference voltage 400 with implementation of the adaptive charging module 300 during operation of the DAC 312 compared to a reference voltage 404 in a SAR ADC that does not include the adaptive charging module 300. Further, in an ADC system including multiple SAR ADCs receiving the reference voltage 400 (e.g., as shown in FIG. 1), respective switches 112 and 116 remain closed at all times. In a tracking phase 408 of the DAC 312

(e.g., a phase where analog values of an analog input voltage are sampled and stored), the pre-charging capacitor 304 is charged to the supply voltage 332, which is greater than the reference voltage Vref. For example, in the tracking phase 408, the switches 316 and 320 are open and the switches 324 and 328 are closed to connect the pre-charging capacitor 304 to the supply voltage 332 and ground 336. In a conversion phase 412 (e.g., a phase where the stored analog values are digitized, having a duration of approximately 4 ns), the pre-charging capacitor 304 is connected to the reference voltage Vref to share charge with the decoupling capacitor 308. In other words, a charge provided by the pre-charging capacitor 304 is combined with a charge provided by the decoupling capacitor 308. For example, in the conversion phase 412, the switches 324 and 328 are open and the switches 316 and 320 are closed to connect the pre-charging capacitor 304 to the decoupling capacitor 308. For example only, the conversion phase 412 includes 7 non-binary MSB steps with conversion redundancy and 6 binary LSB steps without conversion redundancy. An MSB step refers to a portion of the conversion phase associated with converting MSBs of the digital code (e.g., the digital code 216 of FIG. 2). Conversely, an LSB step refers to a portion of the conversion phase associated with converting LSBs of the digital code. In an embodiment where the digital code is 13 bits with conversion redundancy, the MSB step corresponds to a portion of the conversion phase where bits 1-7 of the digital code are converted, and the LSB step corresponds to a portion of the conversion phase where bits 8-13 are converted.

Accordingly, when connected to the pre-charging capacitor 304 prior to and/or in a beginning of the conversion phase 412, the decoupling capacitor 308 is able to initially provide a greater reference voltage 400 as indicated at 416 because the charge of the pre-charging capacitor 304 is combined with the charge of the decoupling capacitor 308. For example, the reference voltage 400 is provided at approximately 0.601 V, and connecting the decoupling capacitor 308 to the charged pre-charging capacitor 304 increases the reference voltage 400 to approximately 0.607 V. When the conversion phase 412 begins, the reference voltage 400 is pulled downward toward approximately 0.599 V, in an embodiment. The reference voltage 400 is relatively stabilized at 0.599 or 0.600 V throughout the conversion phase 412.

A size of the pre-charging capacitor 304 and the supply voltage 332 is selected based on a desired pre-charging voltage level of the reference voltage 400. For example, the pre-charging capacitor 304 and the supply voltage 332 are selected, in accordance with an embodiment, to achieve a pre-charging voltage level that results in a relatively flat (i.e., settled) reference voltage 400 during the conversion phase 412. In some examples, the pre-charging capacitor 304 is a variable or programmable capacitor that is varied according to one or more parameters, such as an amount of current being drawn by the DAC 312. For example, a variable or programmable capacitor includes an array of individual capacitors (e.g., connected in parallel). Each of the individual capacitors is associated with a respective switch or switches that connect the capacitor to a circuit. A capacitance of the programmable capacitor is varied by closing switches of one or more of the capacitors to connect selected ones of the capacitors to the circuit.

Figure 5A:
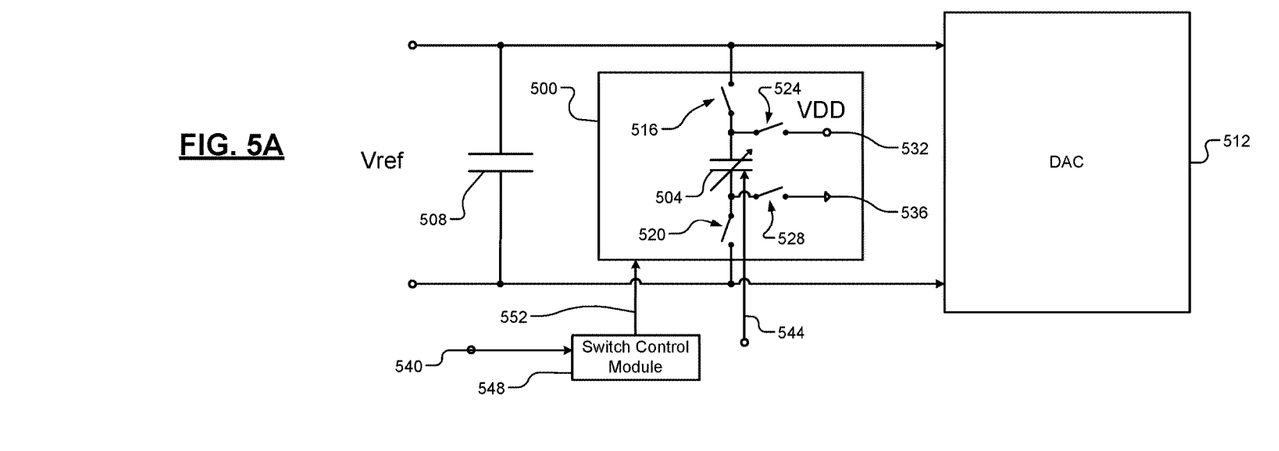
FIG. 5A is a second example of the adaptive charging module of FIG. 2 according to the present disclosure.

FIG. 5A shows a second example adaptive charging module 500 in more detail. The adaptive charging module 500 includes an adaptive charging capacitor 504. For example, the adaptive charging capacitor 504 is connected in parallel with decoupling capacitor 508. A voltage across the decoupling capacitor 508 corresponds to a reference voltage Vref provided to capacitive DAC 512. The adaptive charging capacitor 504 comprises the same material (e.g., metal) as capacitors of the DAC 512. Accordingly, any process and temperature variations affecting the adaptive charging capacitor DAC 512 are analogous to process variations of the capacitors of the DAC 512.

The adaptive charging module 500 includes first and second switches 516 and 520 arranged to selectively connect the adaptive charging capacitor 504 to the reference voltage Vref and the decoupling capacitor 508. Third and fourth switches 524 and 528 selectively connect the adaptive charging capacitor 504 to a supply voltage (VDD) 532 and ground 536. The first, second, third, and fourth switches 516, 520, 524, and 528 are responsive to inputs 540 indicative of various operating phases of the DAC 512. For example, the DAC 512 has a conversion phase, a tracking phase, etc. Accordingly, the inputs 540 correspond to digitized outputs of the DAC 512 indicative of the operating phase, which bits of a digital code are being converted, etc., in an embodiment. In FIG. 5A, the adaptive charging module 500 is shown connected between the decoupling capacitor 508 and the DAC 512.

The adaptive charging capacitor 504 corresponds to a variable capacitor. For example, the adaptive charging capacitor 504 corresponds to a capacitor array, a set of (e.g., 15) capacitors, etc. The adaptive charging capacitor 504 is responsive to input 544 received from a SAR circuit (e.g., the SAR circuit 208). For example, the input 544 is indicative of bits already converted in a beginning of a conversion phase. By way of example only, the indicated bits include 4 bits corresponding to converted bits 2 through 5. Accordingly, a value of the 4 bits corresponds to 0-15 and indicates which of the set of 15 capacitors of the adaptive charging capacitor 504 to select. In other words, one or none of the 15 capacitors of the adaptive charging capacitor 504 is connected at any given time based on the value of the 4 bits provided by the input 544. In an embodiment, the adaptive charging module 500 implements and/or communicates with a switch control module 548. For example, the switch control module 548 is configured to receive the inputs 540 and generate a switching control signal 552 based on the inputs 540 to selectively open and close the switches 516, 520, 524, and 528.

Figure 5B:
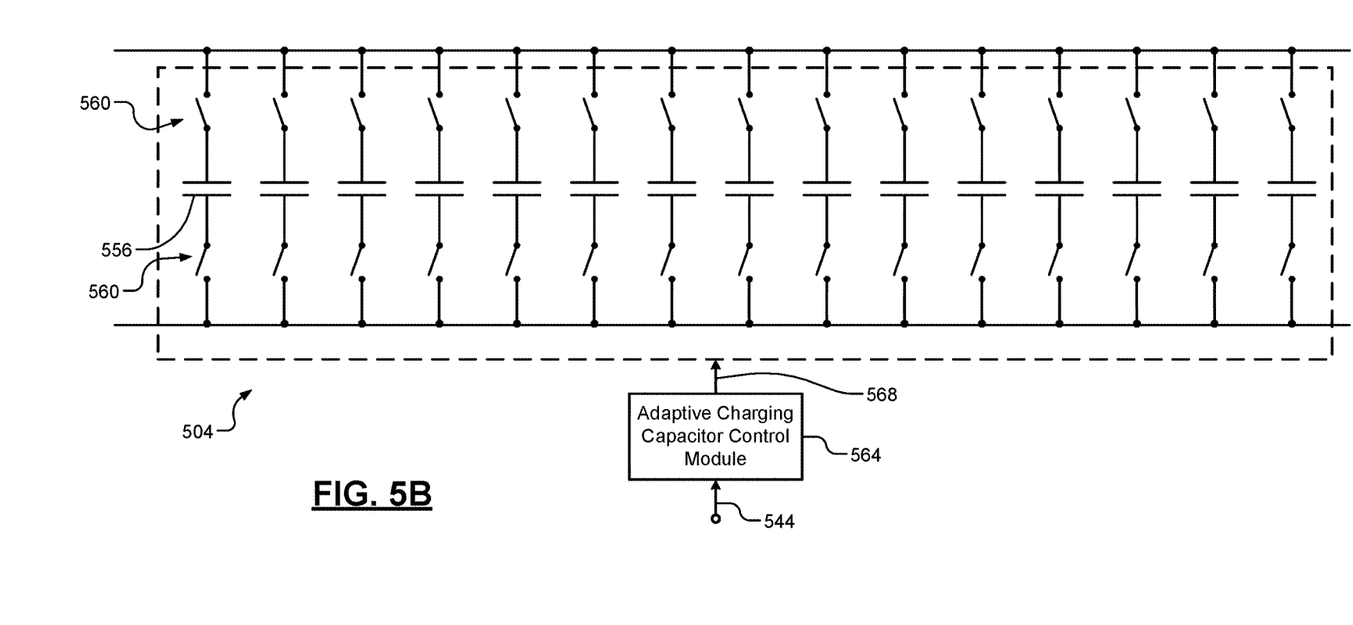
FIG. 5B shows an example adaptive charging capacitor of the adaptive charging module of FIG. 5A according to the present disclosure.

FIG. 5B shows an example of the adaptive charging capacitor 504 (as shown in FIG. 5A) including a set of 15 individually selectable capacitors 556 in more detail. In an embodiment, each of the capacitors 556 has a different capacitance (e.g., size) from other ones of the capacitors 556. Accordingly, a capacitance and charging capability of the adaptive charging capacitor 504 varies based on which of the capacitors 556 is selected and connected and/or, in an embodiment, how many of the capacitors 556 are selected and connected. For example, respective pairs of switches 560 of the capacitors 556 are opened and closed in accordance with the input 544 to connect the capacitors 556 to the supply voltage 532 or selectively connect one of the capacitors 556 to the decoupling capacitor 508. For example, the adaptive charging capacitor 504 implements and/or communicates with an adaptive charging capacitor control module 564 configured to receive the input 544 and generate a switching control signal 568 based on the input 544 to selectively connect none or one of the capacitors 556. Although shown separately, in some examples the adaptive charging capacitor control module 564 and the switch control module 548 are integrated into the same module. For example, in an embodiment, the switch control module 548 is further configured to receive the input 544 and generate the switching control signal 568.

Referring again to FIG. 5A, in a charging phase (e.g., a tracking phase or other phase of the DAC 512 where conversion is not being performed), the adaptive charging capacitor 504 is connected to the supply voltage 532 to be charged. The supply voltage 532 is greater than the reference voltage Vref. In the charging phase, each of the capacitors 556 is connected to the supply voltage 532. For example, the switches 524 and 528 and all of the switches 560 are closed while the switches 516 and 520 are opened. In a conversion phase (e.g., when the DAC 512 is drawing a relatively high level of current), the switches 524 and 528 are opened, and the DAC 512 output is being digitized to approximate the ADC input. Before the conversion ends, a portion of the digital outputs are provided as the input 544, which controls the adaptive charging module 564 to choose one (or none) of the 15 capacitors 556 by closing a respective one of the switches 560 while opening remaining ones of the switches 560. Then, the switch control module 548 closes switches 516 and 520, allowing the charges of the selected ones of the capacitors 556 to be shared with the decoupling capacitor 508. In an embodiment, there are 15 individual ones of the capacitors 556 in the adaptive charging capacitor 504, and for each conversion, only one of the capacitors 556 is connected to the decoupling capacitor 508. In other embodiments, multiple ones of the capacitors 556 are selected together to form an equivalent capacitor that provides a desired capacitance.

Figure 5C:
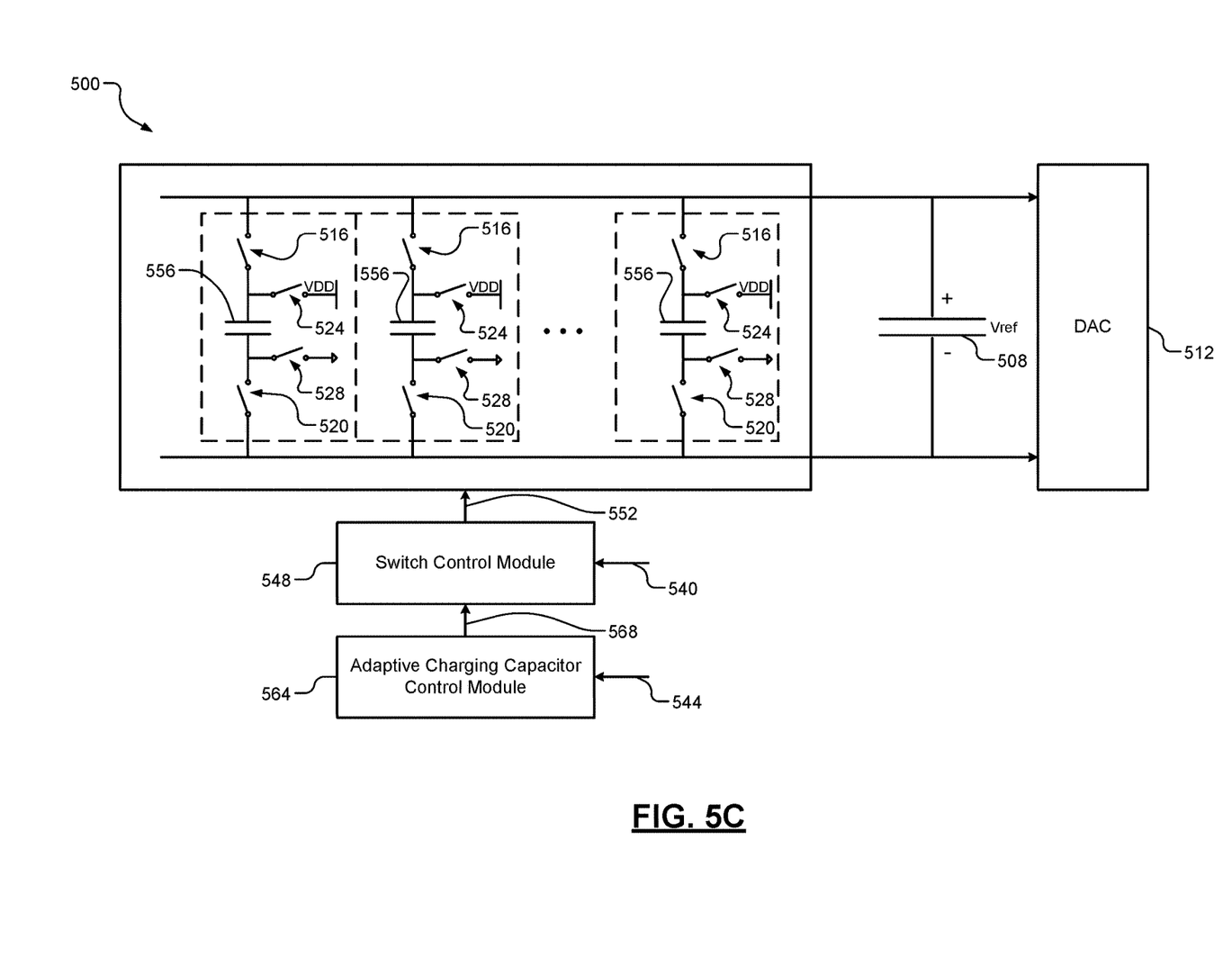
FIG. 5C shows a third example of the adaptive charging module incorporating the adaptive charging capacitor of FIG. 5B.

In another embodiment shown in FIG. 5C, functions of the switch 560 in the adaptive charging capacitor 504 and functions of the switches 524, 528, 516, and 520 in the adaptive charging module 500 can be combined. In this embodiment, the adaptive charging module 500 includes the 15 capacitors 556 of the adaptive charging capacitor 504, and each of the capacitors 556 is selectively connected to the decoupling capacitor 508 and/or the supply voltage 532 via respective switches 516, 520, 524, and 528. The switch control module 548 of FIG. 5C selectively controls the switches 516, 520, 524, and 528 of each of the capacitors 556. The adaptive charging capacitor control module 564 of FIG. 5C provides the switching control signal 568 to the switch control module 548 to indicate which one (or none) of the capacitors 556 to select.

In an embodiment, the switch control module 548 selects an individual one of the capacitors 556 during the ADC conversion phase by closing the switches 516 and 520 and opening the switches 524 and 528 for one of the 15 capacitors 556. If none of the capacitors 556 is selected as indicated by switching control signal 568, switching control signal 552 maintains all of the switches 524 and 528 in a closed position and all of the switches 516 and 520 in an open position for all of the capacitors 556 in the adaptive charging module 500. In the ADC tracking phase, the switch control module 548 closes all of the switches 524 and 528 for all of the capacitors 556 while opening all of the switches 524 and 528 in the adaptive charging module 500.

The size of the adaptive charging capacitor 504 is determined according to total charges drawn by the DAC 512 during a selected portion of the output digitization process. VDD corresponds to a supply voltage 532 sufficient to provide a desired reference voltage after the adaptive charging capacitor 504 shares charges with the decoupling capacitor 508. For example, bits 2, 3, 4, and 5 of the digital code (e.g., as output by the SAR circuit 208) are provided as the input 544 to the adaptive charging capacitor control module 564. Only 4 bits are used in this example because, in some SAR ADC implementations, the charges drawn by the DAC 512 during the first bit (bit 1) conversion is constant, independent of the ADC input, and the conversion from bit 6 to bit n does not cause the DAC 512 to draw significant amount of charges from the decoupling capacitor 508. However, in implementations where more reference voltage stabilization is needed, bits 6 to n may be used. The number of the capacitors 556 may be expanded to accommodate additional bit selections.

Figure 6:
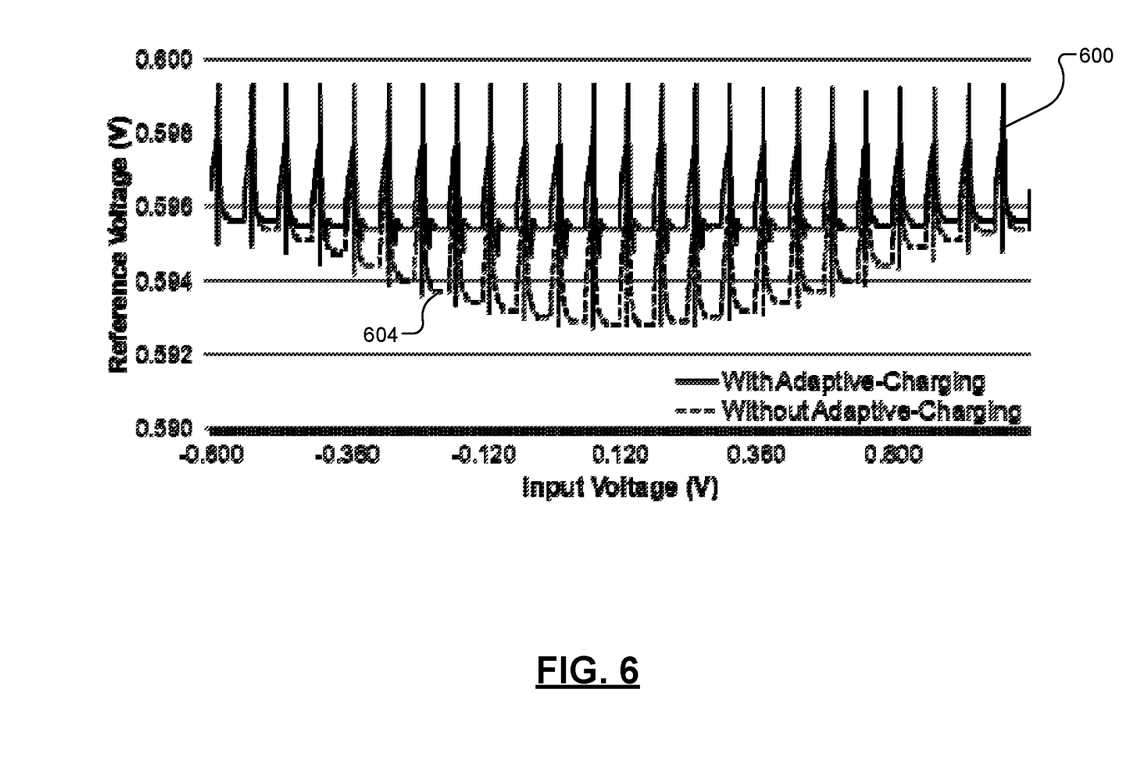
FIG. 6 is an example reference voltage during a conversion phase of the digital-to-analog converter of FIG. 5A according to the present disclosure.

FIG. 6 shows a reference voltage 600 that goes through 24 data conversion cycles (as an example) with implementation of the adaptive charging module 500 compared to a reference voltage 604 in a SAR ADC that does not include the adaptive charging module 500. The reference voltages 600 and 604 are shown with respect to an input voltage (i.e., a voltage input to the SAR ADC for conversion) ranging from −0.600 V to 0.600 V). For example only, a desired steady-state value of a reference voltage Vref during the conversion phase is approximately 0.600 V. Transients of the reference voltage 604 during each conversion cause the reference voltage 604 to drop to as low as 0.593 V (e.g., at an input voltage of approximately 0.120 V), which correspond to an inaccuracy of as many as 9 LSBs at 12-bit resolution. Conversely, due to the shared charge provided to the decoupling capacitor 508 by the adaptive charging capacitor 504, the reference voltage 600 is relatively constant despite transients and variation of the input voltage. Further, the amount of shared charge provided varies with each conversion based on the input voltage. Accordingly, the reference voltage 600 varies by a value corresponding to less than 1 LSB at 12-bit resolution.

Figure 7:
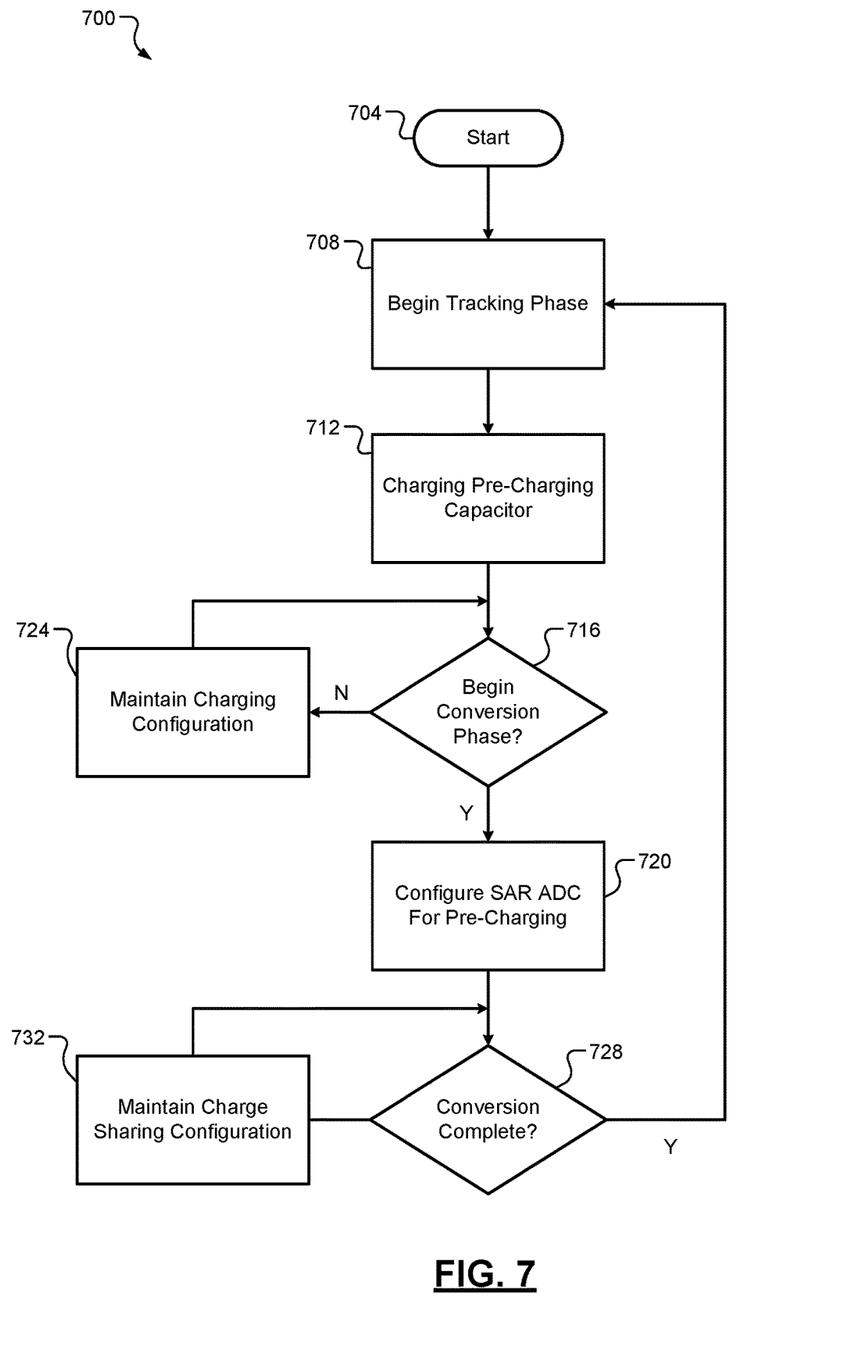
FIG. 7 shows steps of an example pre-charging method for the successive-approximation analog-to-digital converter of FIG. 3.

FIG. 7 shows an example pre-charging method 700 for a SAR ADC beginning at 704. At 708, a DAC (e.g., the DAC 312) begins a tracking phase. At 712, the method 700 (e.g., the switch control module 344) configures the SAR ADC for pre-charging. For example, the switch control module 344 opens the switches 316 and 320 and closes the switches 324 and 328 to connect the pre-charging capacitor 304 to the supply voltage 332 during the tracking phase. In an embodiment, the SAR ADC is configured to charge the pre-charging capacitor at the beginning of each tracking phase and is maintained in the charging configuration until the beginning of a conversion phase. At 716, the method 700 (e.g., the switch control module 344) determines whether the DAC 312 is beginning a conversion phase. For example, the switch control module 344 determines that the conversion phase is beginning and/or the tracking phase is nearing completion based on the input 340. If true (e.g., the input 340 indicates that the conversion phase is beginning), the method 700 continues to 720. If false (e.g., the input 340 indicates that the SAR ADC is still in the tracking phase), the method 700 continues to 724. At 724, the method 700 maintains the charging configuration.

At 720, the method 700 (e.g., the switch control module 344) configures the SAR ADC for charge sharing. For example, the switch control module 344 closes the switches 316 and 320 and opens the switches 324 and 328. At 728, the method 700 (e.g., the switch control module 344) determines whether the DAC 312 is beginning the tracking phase. For example, the switch control module 344 determines that the tracking phase is beginning and/or the conversion phase is nearing completion based on the input 340. If true, the method 700 continues to 708. If false, the method 700 continues to 732. At 732, the method 700 maintains the charge sharing configuration.

Figure 8:
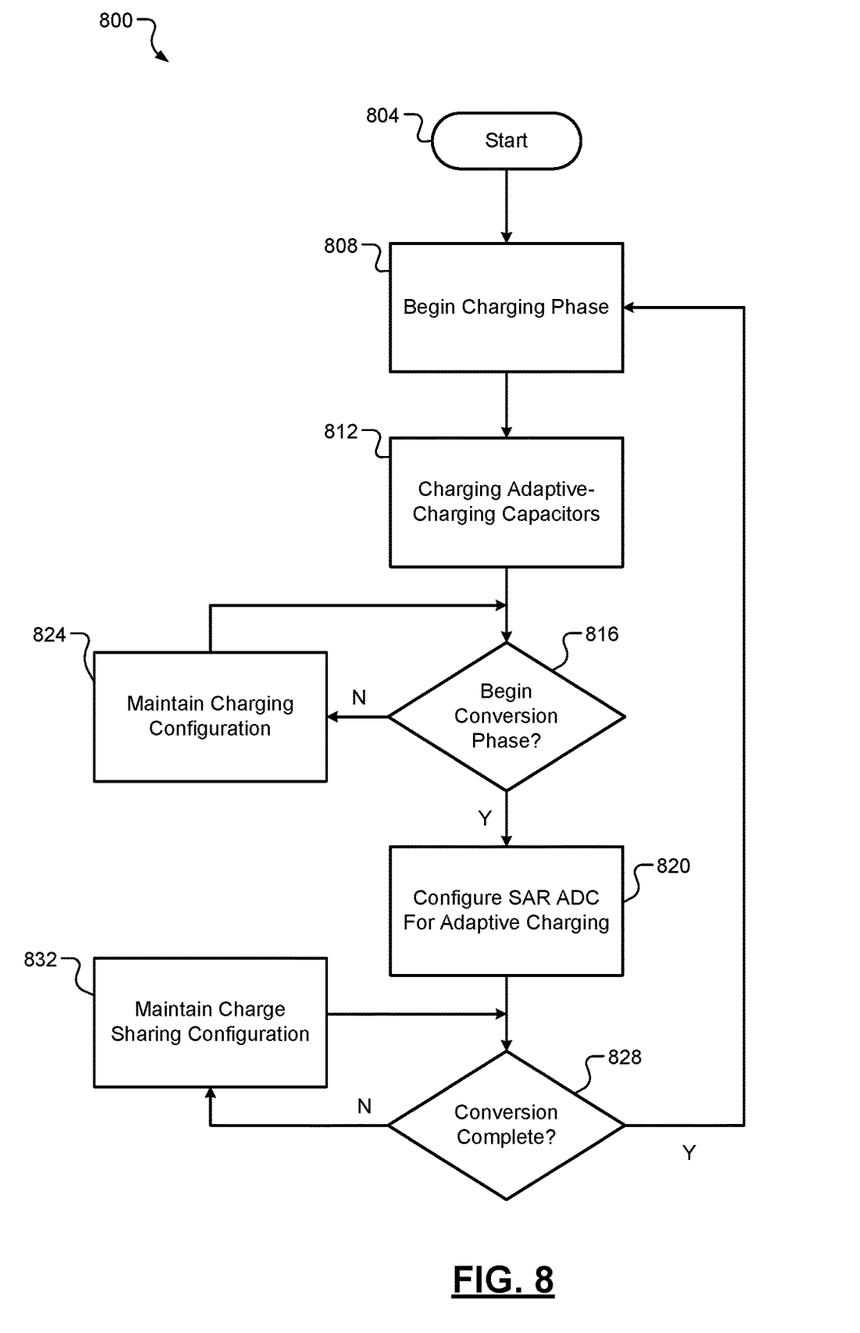
FIG. 8 shows steps of an example adaptive charging method for the successive-approximation analog-to-digital converter of FIG. 3.

FIG. 8 shows an example adaptive charging method 800 for a SAR ADC beginning at 804. At 808, a DAC (e.g., the DAC 512) begins a charging phase. For example, the charging phase corresponds to a tracking phase of the DAC 512. At 812, the method 800 (e.g., the switch control module 548 and/or the adaptive charging capacitor control module 564) configures the SAR ADC for charging. For example, the switch control module 548 opens the switches 516 and 520 and closes the switches 524 and 528, and the adaptive charging capacitor control module 564 closes the switches 560 corresponding to each of the capacitors 556. At 816, the method 800 (e.g., the switch control module 548 and/or the adaptive charging capacitor control module 564) determines whether the DAC 512 is beginning a conversion phase. For example, the switch control module 548 and/or the adaptive charging capacitor control module 564 determines that the conversion phase is beginning and/or the tracking phase is nearing completion based on input 540. If true, the method 800 continues to 820. If false, the method 800 continues to 824. At 824, the method 800 maintains the charging configuration.

At 820, the method 800 configures the SAR ADC for adaptive charging. For example, the switch control module 548 closes the switches 516 and 520 and opens the switches 524 and 528, and the adaptive charging capacitor control module 564 closes the switches 560 corresponding to a selected one of the capacitors 556 and opens the switches 560 corresponding to remaining ones of the capacitors 556. For example only, based on the input 544, the adaptive charging capacitor control module 564 determines the selected one (or none) of the capacitors 556 and the timing for closing the switches 516 and 520.

At 828, the method 800 determines whether the conversion phase is complete. For example, the switch control module 548 and/or the adaptive charging capacitor control module 564 determines that there are no additional conversions to be performed by the DAC 512 based on the input 540 or 544. If true, the method 800 continues to 808. If false, the method 800 continues to 832. At 832, the method 800 maintains the charge sharing configuration.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It is noted that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

What is claimed is:

1. A successive-approximation register (SAR) analog-to-digital converter (ADC) comprising:
    a SAR circuit configured to generate a digital code based on an analog input signal;
    a digital-to-analog converter (DAC) configured to convert the digital code to an analog voltage, wherein the SAR circuit is further configured to generate a digital output signal based on a comparison between the analog input signal and the analog voltage;
    a first capacitor configured to provide a reference voltage to the DAC; and
    an adaptive charging module configured to stabilize the reference voltage provided to the DAC, wherein, to stabilize the reference voltage, the adaptive charging module is configured to
        receive an indication of an operating phase of the ADC, and
        based on the indication, (i) selectively connect to a supply voltage during a first operating phase of the ADC to store a charge in the adaptive charging module, and (ii) selectively connect to the first capacitor during a second operating phase of the ADC to combine the charge stored in the adaptive charging module with a charge of the first capacitor.

2. The SAR ADC of claim 1, wherein the supply voltage is greater than the reference voltage.

3. The SAR ADC of claim 1, wherein the first operating phase corresponds to a tracking phase of the ADC and the second operating phase corresponds to a conversion phase of the ADC.

4. The SAR ADC of claim 1, wherein the adaptive charging module includes a second capacitor configured to store the charge of the adaptive charging module, and wherein (i) selectively connecting to the supply voltage during the first operating phase includes connecting the second capacitor to the supply voltage to charge the second capacitor and (ii) selectively connecting to the first capacitor during the second operating phase includes connecting the second capacitor to the first capacitor to combine a charge of the second capacitor with the charge of the first capacitor.

5. The SAR ADC of claim 4, wherein the adaptive charging module includes (i) a first switch and a second switch to selectively connect the second capacitor to the first capacitor to combine the charge of the second capacitor with the charge of the first capacitor and (ii) a third switch and a fourth switch to selectively connect the second capacitor to the supply voltage to charge the second capacitor.

6. The SAR ADC of claim 5, further comprising a switch control module configured to, based on the received indication of the operating phase of the DAC, (i) open the first switch and the second switch and close the third switch and the fourth switch to charge the second capacitor and (ii) close the first switch and the second switch and open the third switch and the fourth switch to combine the charge of the second capacitor with the charge of the first capacitor.

7. The SAR ADC of claim 1, wherein the adaptive charging module includes at least one second capacitor, and wherein (i) selectively connecting to the supply voltage during the first operating phase includes connecting the at least one second capacitor to the supply voltage to charge the at least one second capacitor, (ii) selectively connecting to the first capacitor during the second operating phase includes connecting the at least one second capacitor to the first capacitor to share a charge of the at least one second capacitor with the first capacitor, the adaptive charging module further configured to selectively adjust a capacitance of the at least one second capacitor during the second operating phase.

8. The SAR ADC of claim 7, wherein the at least one second capacitor includes a plurality of capacitors, and wherein to selectively adjust the capacitance of the at least one second capacitor, the adaptive charging module is further configured to connect a selected capacitor of the plurality of capacitors to the first capacitor.

9. The SAR ADC of claim 8, wherein the at least one second capacitor includes a plurality of respective switches arranged to connect selected ones of the plurality of capacitors to the first capacitor, wherein connecting selected ones of the plurality of capacitors to the first capacitor varies an amount of charge of the at least one second capacitor that is combined with the charge of the first capacitor.

10. The SAR ADC of claim 9, further comprising an adaptive charging capacitor control module configured to (i) receive a second indication of which of the plurality of capacitors to connect to the first capacitor and (ii) selectively connect the plurality of capacitors to the first capacitor based on the second indication.

11. A method of operating a successive-approximation register (SAR) analog-to-digital converter (ADC) including a digital-to-analog converter (DAC), the method comprising:
generating a digital code based on an analog input signal;
converting the digital code to an analog voltage, wherein converting the digital code to the analog voltage includes
providing a reference voltage from a first capacitor for conversion of the digital code to the analog voltage, and
stabilizing the reference voltage by
receiving an indication of an operating phase of the ADC, and
based on the indication, (i) selectively connecting at least one second capacitor to a supply voltage during a first operating phase of the ADC to store a charge in the at least one second capacitor, and (ii) selectively connecting to the first capacitor during a second operating phase of the ADC to combine the charge of the at least one second capacitor with a charge of the first capacitor; and
generating a digital output signal based on a comparison between the analog input signal and the analog voltage.

12. The method of claim 11, further comprising, based on the received indication of the operating phase of the ADC, (i) opening a first switch and a second switch and closing a third switch and a fourth switch to charge the at least one second capacitor and (ii) closing the first switch and the second switch and opening the third switch and the fourth switch to combine the charge of the at least one second capacitor with the charge of the first capacitor.

13. The method of claim 11, further comprising selectively adjusting a capacitance of the at least one second capacitor during the second operating phase.

14. The method of claim 13, wherein selectively adjusting the capacitance of the at least one second capacitor includes connecting a selected capacitor of a plurality of capacitors of the at least one second capacitor to the first capacitor.

15. The method of claim 14, wherein connecting the selected capacitor of the plurality of capacitors to the first capacitor varies an amount of charge of the at least one second capacitor that is combined with the charge of the first capacitor.

16. The method of claim 15, further comprising (i) receiving a second indication of which of the plurality of capacitors to connect to the first capacitor and (ii) selectively connecting the plurality of capacitors to the first capacitor based on the second indication.

* * * * *